United States Patent
Song

(10) Patent No.: US 8,242,509 B2
(45) Date of Patent: Aug. 14, 2012

(54) LIGHT EMITTING DEVICE

(75) Inventor: Hyun Don Song, Incheon (KR)

(73) Assignee: LG Innotek Co., Ltd., Seoul (KR)

( * ) Notice: Subject to any disclaimer, the term of this patent is extended or adjusted under 35 U.S.C. 154(b) by 164 days.

(21) Appl. No.: 12/699,991

(22) Filed: Feb. 4, 2010

(65) Prior Publication Data
US 2010/0207123 A1    Aug. 19, 2010

(30) Foreign Application Priority Data

Feb. 18, 2009    (KR) .................. 10-2009-0013572

(51) Int. Cl.
*H01L 33/00* (2010.01)
(52) U.S. Cl. ............ 257/76; 257/79; 257/98; 257/103; 257/E33.023; 257/E21.158
(58) Field of Classification Search .............. 257/13, 257/79–103, 918, E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 5,499,124 | A | 3/1996 | Vu et al. |
| 2002/0139987 | A1 | 10/2002 | Collins, III et al. |
| 2007/0007584 | A1 | 1/2007 | Hwang et al. |
| 2007/0200122 | A1 | 8/2007 | Kim et al. |
| 2007/0215881 | A1 | 9/2007 | Yamamoto et al. |
| 2008/0179602 | A1 | 7/2008 | Negley et al. |
| 2008/0211416 | A1 | 9/2008 | Negley et al. |

FOREIGN PATENT DOCUMENTS

| | | |
|---|---|---|
| CN | 101145570 A | 3/2008 |
| EP | 0 011 418 | 5/1980 |
| JP | 2002-9337 | 1/2002 |
| JP | 2006-286991 | 10/2006 |
| KR | 10-2004-005270 | 1/2004 |
| KR | 10-2007-0088145 | 8/2007 |
| KR | 10-0752721 | 8/2007 |
| KR | 10-0845549 | 7/2008 |
| WO | WO 03/017320 | 2/2003 |

OTHER PUBLICATIONS

European Search Report issued in EP Application No. 10150474.4 dated Jul. 7, 2010.
Notice of Allowance issued in KR Application No. 10-2009-0013572 dated Dec. 2, 2010.
International Search Report issued in PCT/KR2009/002689 dated Mar. 11, 2010.
Chinese Office Action issued in CN Application No. 201010110398.6 dated Jun. 27, 2011.

*Primary Examiner* — Mamadou Diallo
(74) *Attorney, Agent, or Firm* — KED & Associates, LLP

(57) ABSTRACT

A light emitting device is provided. The light emitting device may include a plurality of light emitting elements formed on a first common electrode, each light emitting element having a first conductive layer formed over the first common electrode. The light emitting device may also include an active layer formed over the first conductive layer, a second conductive layer formed over the active layer, and an insulator formed between adjacent light emitting elements. A plurality of electrodes may be respectively formed on the plurality of light emitting elements, and a second common electrode may couple the plurality electrodes. Such a light emitting structure may improve emission characteristics, heat dissipation and high temperature reliability.

21 Claims, 9 Drawing Sheets

LIGHT EMITTING DEVICE

This claims the benefit under 35 U.S.C. §119 of Korean Patent Application No. 10-2009-0013572, filed in Korea Feb. 18, 2009, the entirety of which is incorporated herein by reference.

BACKGROUND

1. Field

Embodiments as broadly described herein relate to a light emitting device.

2. Background

A light emitting device is a semiconductor device that converts current into light. A red light emitting device may be used as a light source for electronic devices, information telecommunication devices, and the like, together with a green light emitting device. One example of such light emitting devices is a light emitting diode (LED). Due to widespread use of such devices, improvements in reliability and performance of such devices is desirable.

BRIEF DESCRIPTION OF THE DRAWINGS

The embodiments will be described in detail with reference to the following drawings in which like reference numerals refer to like elements wherein.

DETAILED DESCRIPTION

Hereinafter, a light emitting device according to embodiments as broadly described herein will be discussed with reference to the accompanying drawings.

In the description of embodiments, when a layer (or film) is referred to as being 'on/over' another layer or substrate, it may be directly on/over another layer or substrate, or intervening layers may be present. Further, when a layer is referred to as being 'under/below' another layer, it may be directly under/below another layer, or one or more intervening layers may be present. In addition, when a layer is referred to as being 'between' two layers, it may be the only layer between the two layers, or one or more intervening layers may also be present.

Gallium nitride (GaN) semiconductors have high thermal stability and a wide bandgap that may be combined with other elements, such as, for example, In, Al, and the like, making it possible to manufacture a semiconductor layer that emits green light, blue light, and white light while easily controlling emission wavelength. As a result, the gallium nitride (GaN) semiconductor may be seriously considered in developing a high output electronic device including a light emitting device such as an LED.

A high current, such as, for example, 350 mA or more, may be applied to a large area light emitting device. Current applied to an N-type electrode pad typically generates current spreading. However, when a high current is applied, current has straightness at the shortest distance with respect to a P-type electrode, rather than the current spreading described above, causing a current bottleneck phenomenon. The current bottleneck phenomenon may cause degradation of an Epi layer, leaving the device vulnerable to radiating characteristics if the device is driven for a long time in a high temperature environment.

Figure 1:
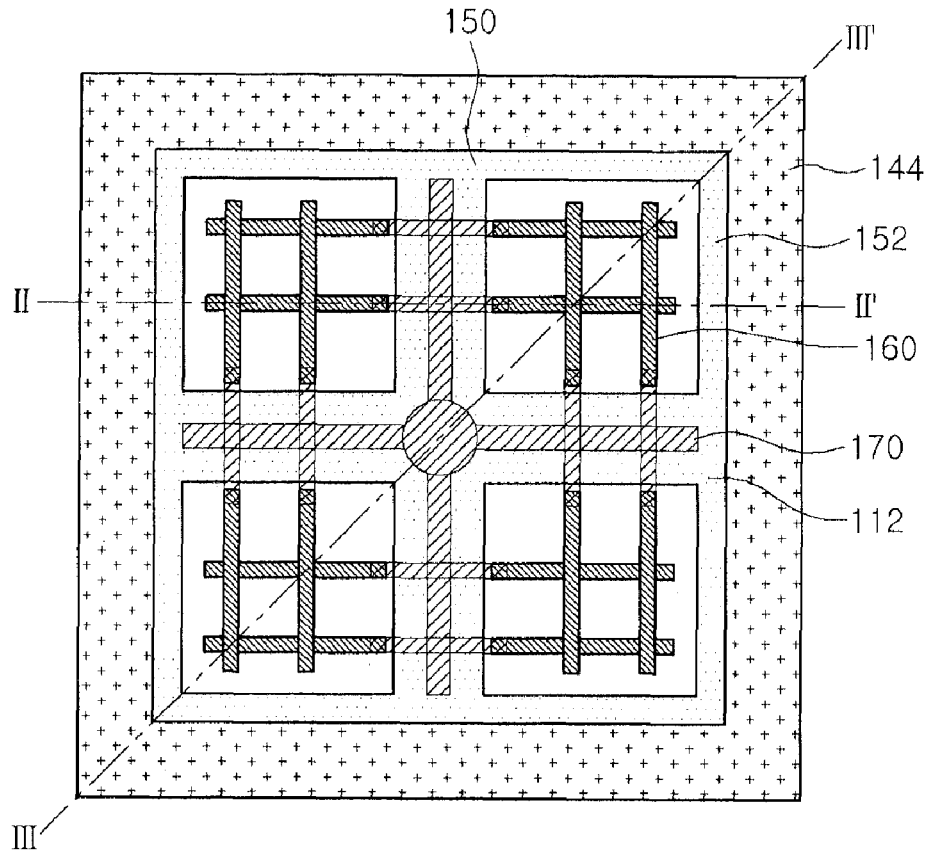
FIG. 1 is a plan view of a light emitting device according to an embodiment as broadly described herein.
Figure 2:
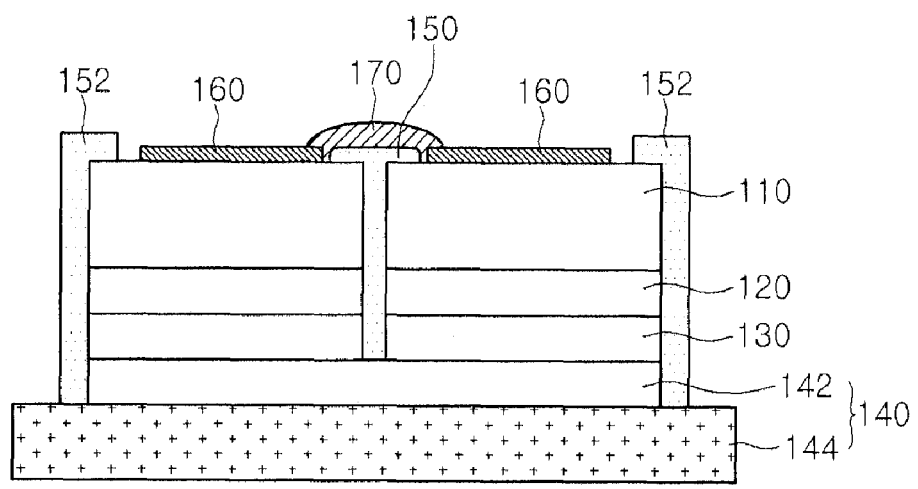
FIG. 2 is a cross-sectional view taken along line II-II' of the light emitting device shown in FIGS. 1-2.

A light emitting device in accordance with the exemplary embodiment shown in FIGS. 1-2 may include a second conductive semiconductor layer 130, an active layer 120, a first conductive semiconductor layer 110, a first insulating layer 150 that separates the first conductive semiconductor layer 110, the active layer 120, and the second conductive semiconductor layer 130 into a plurality of areas, first electrodes 160 that are formed over upper surfaces of the separated first conductive semiconductor layers 110, and a pad electrode 170 that is formed over the first insulating layer 150 to connect the first electrodes 160.

In certain embodiments, the second conductive semiconductor layer 130 may be approximately 100~500 nm thick and may be made of materials such as, for example, GaN, InGaN, InAlGaN, AlGaN, InGaAlP, AlGaAs; the active layer 120 may be approximately 10~100 nm thick and may be made of materials such as, for example, InGaN/GaN, InGaN/InGaN; the first conductive semiconductor layer 110 may be approximately 1000~10000 nm thick and may be made of materials such as, for example, GaN, InGaN, InAlGaN, AlGaN, InGaAlP, AlGaAs; the first insulating layer 150 may be made of materials such as, for example, Oxide, Nitride, Polymer film; the first electrodes 160 may be approximately 10~5000 nm thick and may be made of materials such as, for example, Cr, Ni, Ti, Al, Ag, Pt, Pd, Au; and the pad electrode 170 may be approximately 100~5000 nm thick and may be made of materials such as, for example, Cr, Ni, Ti, Al, Ag, Pt, Pd, Au. Other combinations of thicknesses and/or materials may also be appropriate.

As discussed above, in manufacturing a large area light emitting device, an electrode structure that can provide smooth current flow and avoid a current bottleneck phenomenon is needed. However, in the case of a vertical type GaN light emitting device, current applied to an electrode pad formed over an N-type electrode is light-emitted while spreading into a light emitting surface through an N-type electrode. As discussed above, in the case of the large area light emitting device, when a high current is applied, the current bottleneck phenomenon is caused.

In an embodiment in which parallel type electrode structures are formed over GaN LEDs, the structures may be separated in order to control the current bottleneck phenomenon caused due to the application of high current, making it possible to achieve smooth current spreading. Such a large area light emitting device may be structured so that luminous strength may be relatively uniformly distributed over the area by the smooth current spreading, and may prevent degradation of the Epi layer due to the current bottleneck wile also improving high-temperature reliability.

The general electrode structure may have a structure in which a wing electrode conforms to a pad electrode. Even in the separated case, since it is a serial type, the current bottleneck phenomenon may occur around the pad electrode when a high current is applied. Since the breakdown current spreading of the Epi layer is not smooth due to the current bottleneck phenomenon caused by the application of high current, the problems discussed above, such as non-uniform emission strength between the light emitting surfaces and the degradation in high temperature reliability during extended operation may still occur.

Figure 18:
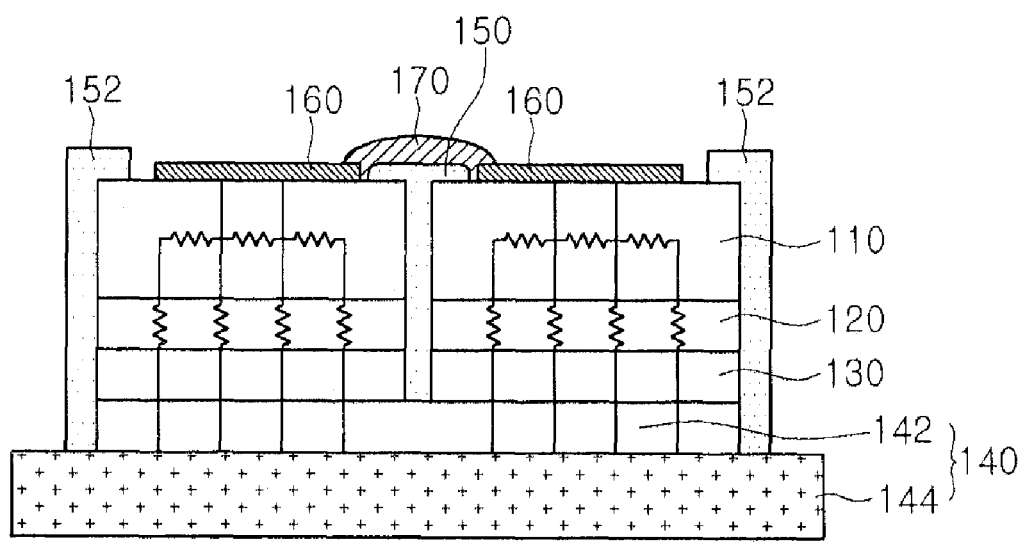
FIGS. 18 and 19 illustrate current spreading characteristics of the light emitting device shown in FIGS. 1-2.
Figure 19:
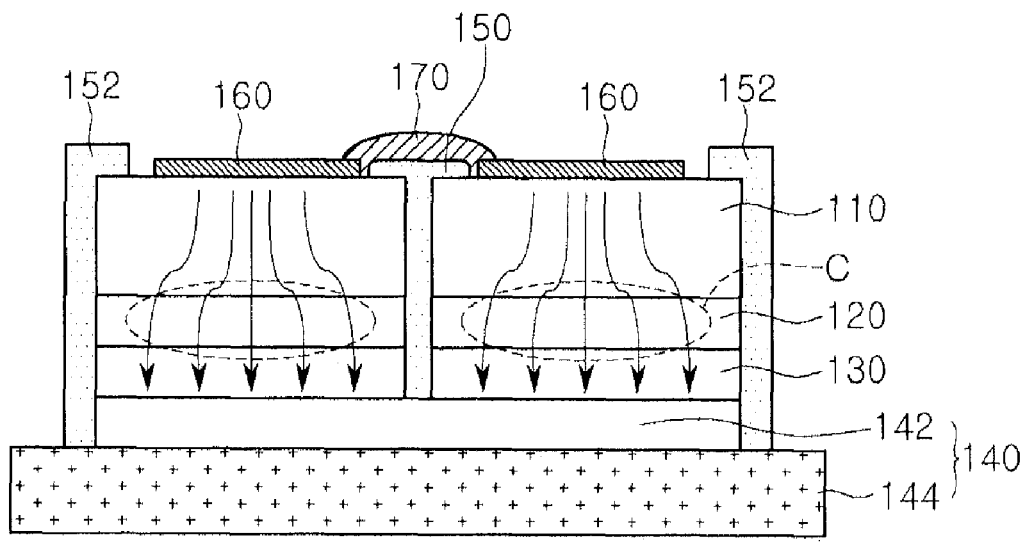

In a parallel type electrode structure in accordance with an embodiment as broadly described herein, the pad electrode 170 may be positioned over the first insulating layer 150 and the first electrodes 160 may be positioned over the light emitting surface. In this structure current applied to the pad electrode 170 flows to the first electrodes 160 of the light emitting surfaces, which are divided in four quadrants by the pad electrode 170 formed over the first insulating layer 150, then to the pad 170 and the first electrode 160 which contact each other in parallel, as shown in FIGS. 18 and 19.

The pad electrode 170 and the first electrode 160, which contact each other in parallel, may have the same current density (C) at each of the four divided light emitting surfaces such that a light emitting surface having a uniform emission strength may be achieved.

In addition, by isolating the relatively wider specific surface area, heat generated during extended high temperature operation may be more effectively dissipated, thus improving high temperature reliability and performance characteristics in applications such as BLU, and the like.

As the area of the light emitting device such as an LED is increased, driving the LED with a high current application scheme may benefit from improvement of the electrode structure. Therefore, the parallel type electrode structure as embodied and broadly described herein may be focused on the development of an electrode structure for a large area LED display device. The parallel type electrode as embodied and broadly described herein may be applied to a vertical type LED as well as a horizontal type LED, and may also be applied to an N-electrode as well as a P-electrode.

Hereinafter, a method for manufacturing a light emitting device according to an embodiment as broadly described herein will be discussed with reference to FIGS. 3 to 17.

First, a first substrate 100 may be prepared. The first substrate 100 may be a sapphire ($Al_2O_3$) single crystal substrate, a SiC substrate, or the like, and is not limited thereto. A wet cleaning operation may be performed on the first substrate to remove impurities. Simply for ease of illustration, the first substrate 100 is only shown in FIG. 3A. Thereafter, the first conductive semiconductor layer 110 may be formed over, or on, the first substrate 100. This process will be described under the assumption that the first substrate is positioned over the first conductive semiconductor layer 110 based on the orientation shown in the drawings.

The first conductive semiconductor layer 110 may include an N type GaN layer formed by a Chemical Vapor Deposition (CVD) method, a Molecular Beam Epitaxy (MBE) method, a sputtering, or a Hydride Vapor Phase Epitaxy (HVPE) method, or other method as appropriate. Further, the first conductive semiconductor layer 110 may be formed by implanting silane gas ($SiH_4$) including n type impurities, such as trimethyl gallium gas (TMGa), ammonia gas ($NH_3$), nitrogen gas ($N_2$), silicon (Si), and the like, in a chamber.

In alterative embodiments, an undoped semiconductor layer (not shown) may be formed over the first substrate, and the first conductive semiconductor layer 110 may be formed over the undoped semiconductor layer. For example, an undoped GaN layer may be formed over the first substrate.

After the first conductive semiconductor layer 110 is formed over the first substrate, the active layer 120 may be formed over the first conductive semiconductor layer 110. The active layer 120 may be a layer that emits light having energy determined by a unique energy band of an activation (light emitting layer) material by impinging electrons injected through the first conductive semiconductor layer 110 and holes injected through the second conductive semiconductor layer 130. The active layer 120 may have a quantum well structure formed by alternately stacking a nitride semiconductor thin film layer having a different energy band one time or several times. For example, the active layer 120 may have a multi quantum well structure having an InGaN/GaN structure by implanting trimethyl gallium gas (TMGa), ammonia gas ($NH_3$), nitrogen gas ($N_2$), trimethyl indium gas (TMIn), but is not limited thereto.

Thereafter, the second conductive semiconductor layer 130 may be formed over the active layer 120. For example, the second conductive semiconductor layer 130 may be formed in a P type GaN layer by implanting bicetyl cyclophentadienyl magnesium (EtCp2Mg) {$Mg(C_2H_5C_5H_4)_2$ including p type impurities, such as trimethyl gallium gas (TMGa), ammonia gas ($NH_3$), nitrogen gas ($N_2$), magnesium (Mg), in a chamber, but is not limited thereto.

Next, a second electrode layer 140 may be formed over the second conductive semiconductor layer 130. The second electrode layer 140 may include an ohmic layer 142 and a second substrate 144. The second electrode layer may also include a reflective layer 143 and a coupling layer 145. Simply for ease of illustration, the reflective layer 143 and the coupling layer 145 are only shown in FIG. 3B.

The second layer 140 may be formed by stacking a single metal, a metal alloy, a metal oxide, and the like, in plurality in order to effectively perform a hole injection. For example, the ohmic layer 142 may include at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, or Ni/IrOx/Au/ITO, but is not limited thereto.

When the second electrode layer 140 includes a reflective layer, such a reflective layer may be formed of a metal layer including Al, Ag, or an alloy including Al or Ag. These materials effectively reflect light generated from the active layer 120, making it possible to remarkably improve light extraction efficiency of the light emitting device.

Further, when the second electrode layer 140 includes a coupling layer, the reflective layer may also act as the coupling layer, or the coupling layer may be formed of nickel (Ni), or gold (Au), and may be provided in addition to or instead of the reflective layer.

The second layer 140 may include the second substrate 144. When the first conductive semiconductor layer 110 has a sufficient thickness of 50 or more, a process of forming the second substrate 144 may be omitted. In order to effectively inject holes, the second substrate 144 may be formed of a metal having excellent conductivity, a metal alloy, or a conductive semiconductor material. For example, the second substrate 144 may be copper (Cu), copper alloy, Si, Mo, SiGe, or the like. A method for forming the second substrate 144 may include a electrochemical metal deposition method, a bonding method using an eutectic metal, or other method as appropriate.

Thereafter, the first substrate may be removed so that the first conductive semiconductor layer 110 is exposed. A method for removing the first substrate may include a method of separating the first substrate using high-output laser or a chemical etching method. Further, the first substrate may be removed by being physically ground. Removing the first substrate exposes the first conductive semiconductor layer 110.

Hereinafter, a process of forming the first insulating layer 150 will be described with reference to FIGS. 5 to 12.

Figure 3A:
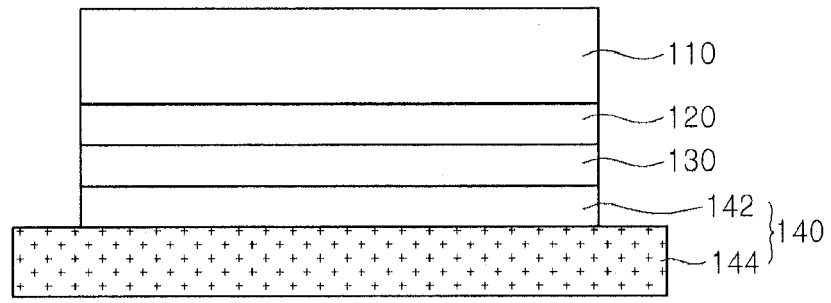
FIGS. 3 to 17 are process diagrams of a method for manufacturing the light emitting device shown in FIGS. 1-2.
Figure 3B:
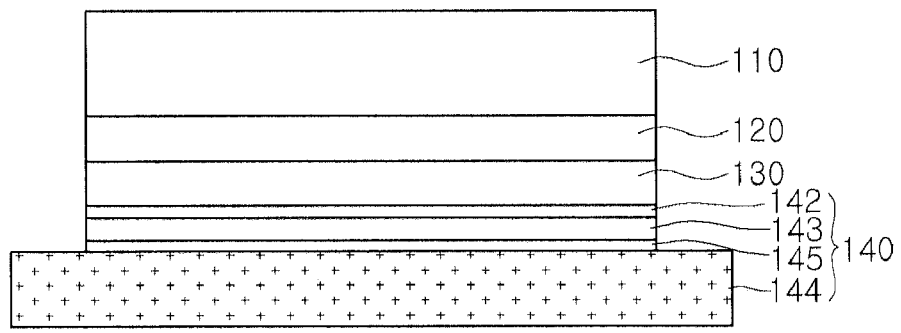
Figure 4:
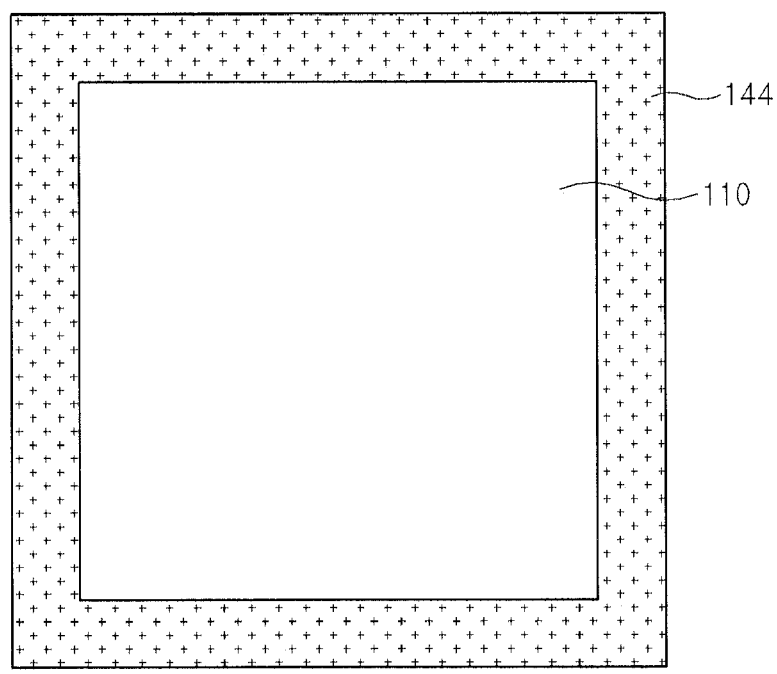
Figure 5:
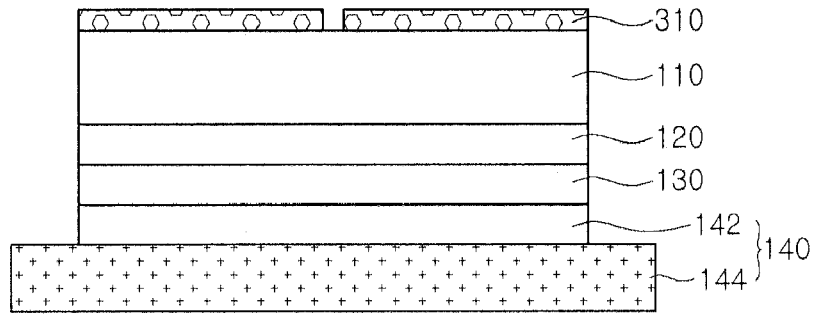
Figure 6:
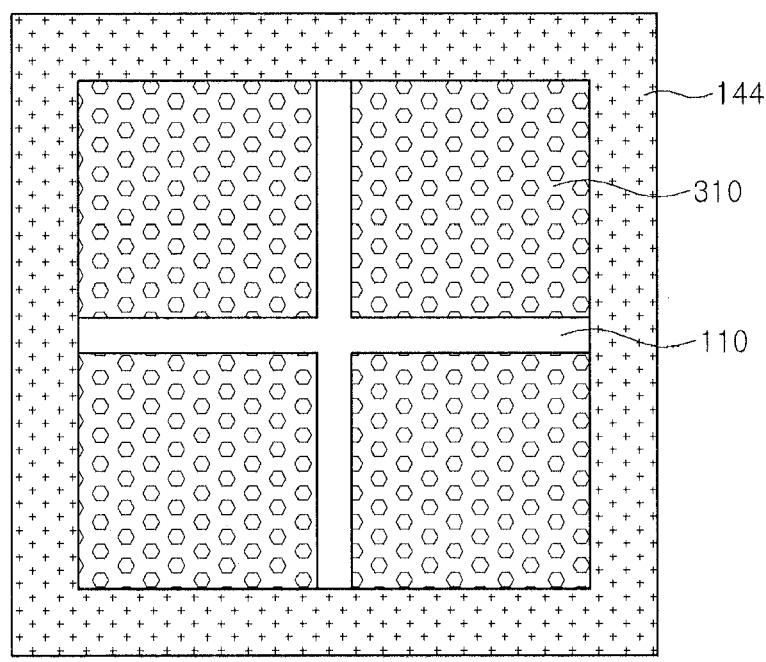

As shown in FIGS. 5 and 6, a first pattern 310 may be formed over the first conductive semiconductor layer 110. For example, the first pattern 310 may expose an area in which a trench may be formed with a photosensitive film or an insulating film. Portions of the first conductive semiconductor layer 110, the active layer 120, the second conductive semiconductor layer 130, and the second electrode layer 140 may be removed along with a process of forming a trench T (see FIG. 7). Removal of the outer portions of the first conductive semiconductor layer 110, the active layer 120, the second conductive semiconductor layer 130, and the second electrode layer 140 allow for coupling of a second insulating layer 152 thereto. As shown in FIG. 3A, a portion of the outer portion of the ohmic layer 142 in the second electrode layer 140 may also be removed, but the embodiment is not limited thereto.

Figure 7:
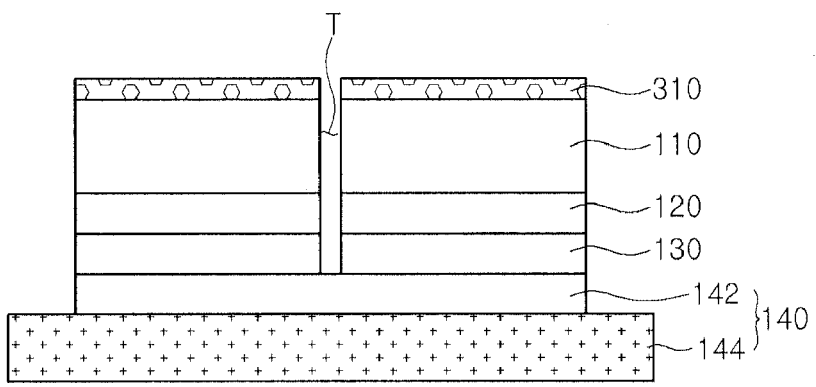
Figure 8:
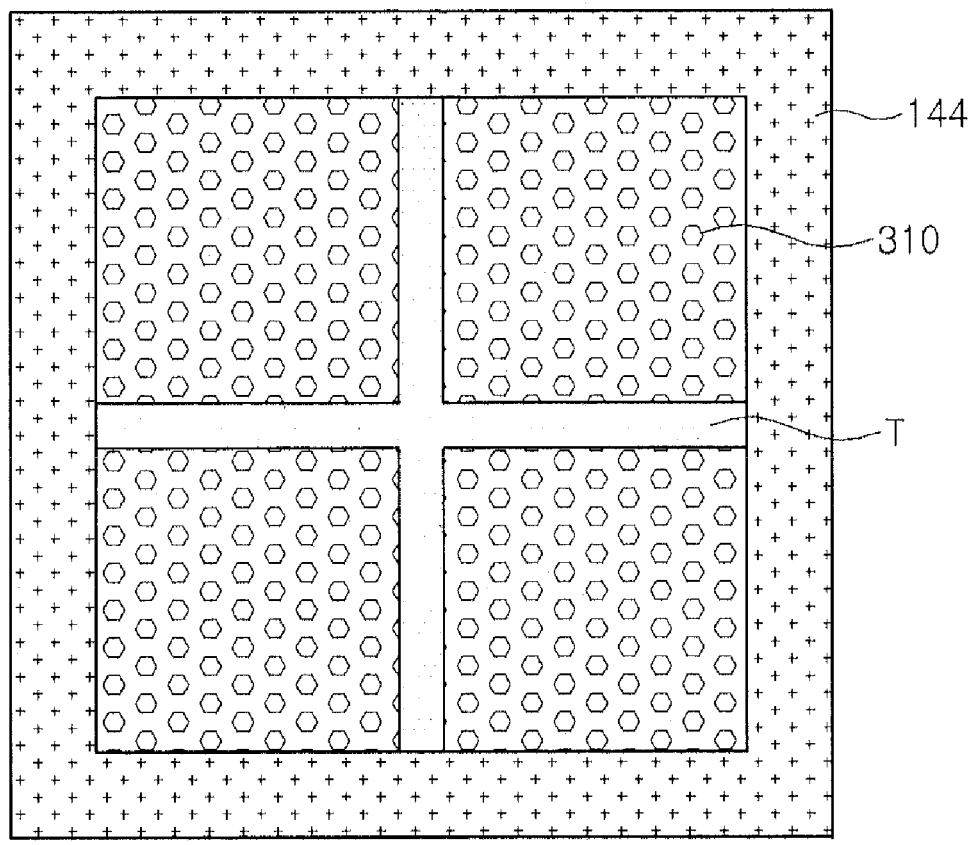

Next, as shown in FIGS. 7 and 8, a portion of the first conductive semiconductor layer 110, the active layer 120, and the second conductive semiconductor layer 130 may be etched using the first pattern 310 as an etch mask to form the trench T. For example, the trench T may be formed by dry or wet etching. The trench T may be a cross type as shown in FIG. 8, but is not limited thereto. The trench T may separate the LED chip into a plurality of areas in various forms. In this embodiment, the trench T may be formed by being etched to the second conductive semiconductor layer 130. In certain embodiments, the trench T may also extend into a portion of the second electrode layer 140.

Figure 9:
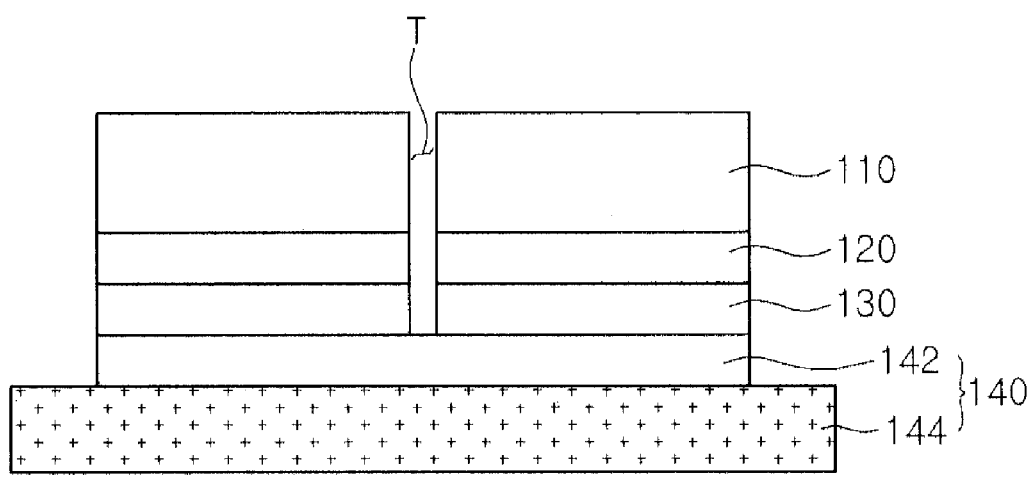
Figure 10:
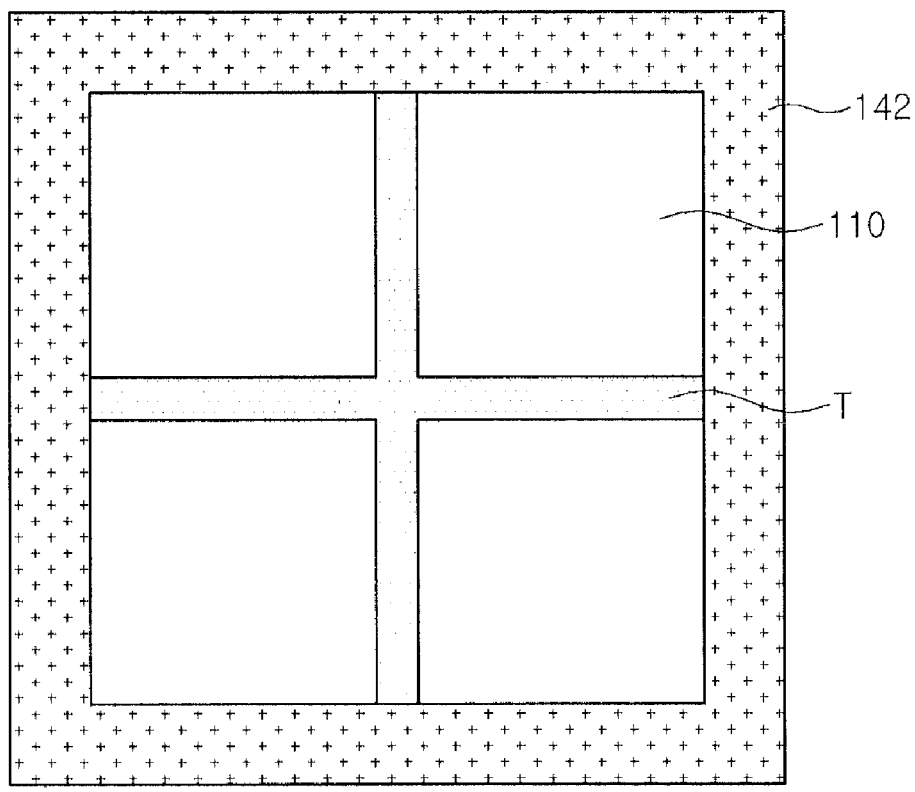

Subsequently, the first pattern 310 may be removed as shown in FIGS. 9 and 10. For example, the first pattern 310 may be removed by an ashing method, a wet etching method, or other method as appropriate.

Figure 11:
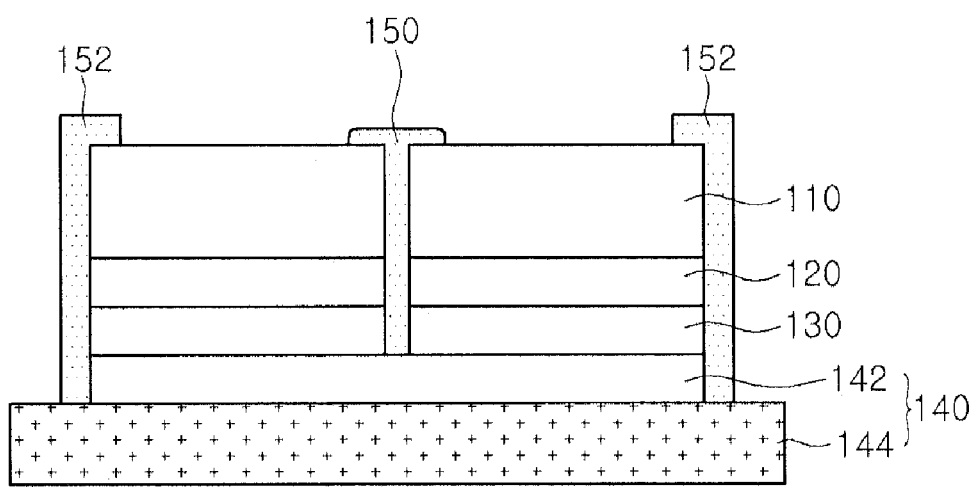
Figure 12:
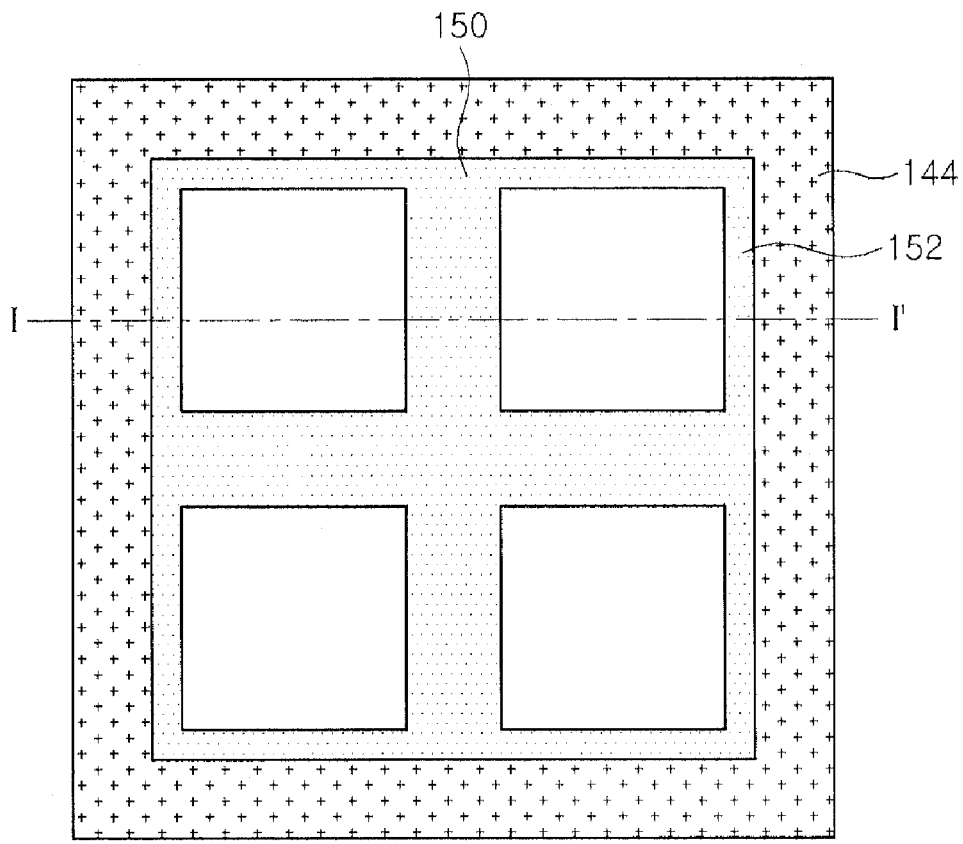

Next, the first insulating layer 150 may be formed as shown in FIGS. 11 and 12 to fill the trench T. For example, the first insulating layer 150 may be formed of insulating film such an oxide film or a nitride film. FIG. 11 is a cross-sectional view taken along line I-I' of FIG. 12.

The second insulating layer 152 surrounding the outer portions of the first conductive semiconductor layer 110, the active layer 120, and the second conductive semiconductor layer 130, may be formed along with the formation of the first insulating layer 150. For example, a passivation layer surrounding the outer portions of the first conductive semiconductor layer 110, the active layer 120, the second conductive semiconductor layer 130 may be formed of an insulating film such as an oxide film or a nitride film, etc.

Figure 13:
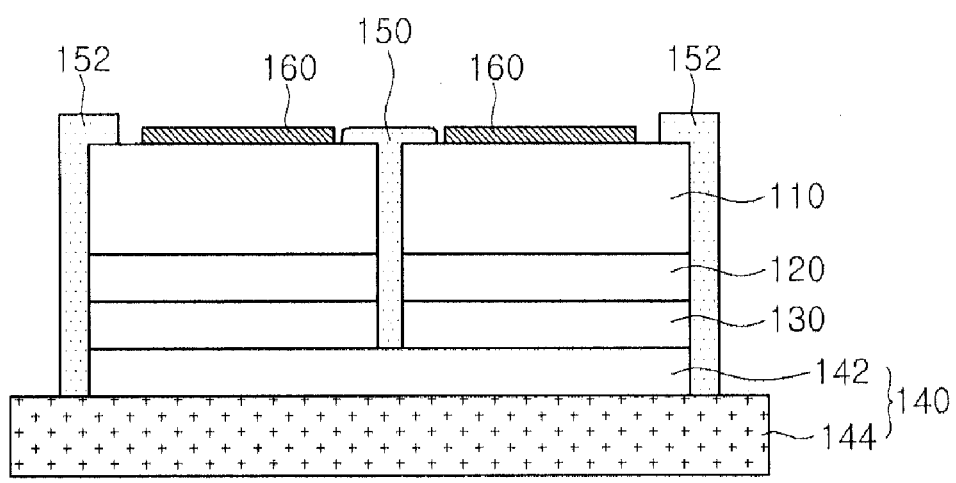
Figure 14:
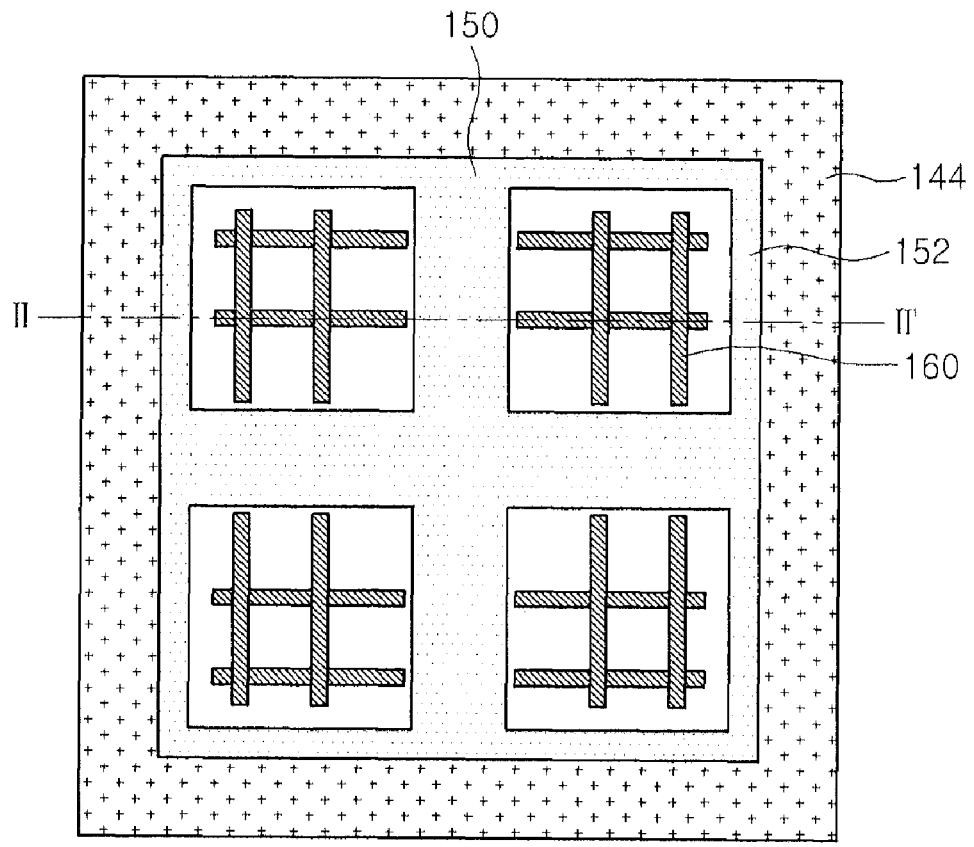

Next, as shown in FIGS. 13 and 14, the first electrodes 160 may each be formed over the separated first conductive semiconductor layer 110. FIG. 13 is a cross-sectional view taken along line II-II' of FIG. 14.

In this embodiment, the first electrode 160 contacts the first conductive semiconductor layer 110 over a wide range, but may be formed such that less of the first electrode 160 covers a portion of the first conductive semiconductor layer 110 from which light is emitted. For example, the first electrode 160 may be formed as a grid. Alternatively, the first electrodes 160 may each be formed over the separated first conductive semiconductor layer 110 in a wing type. Other arrangements may also be appropriate.

Figure 15:
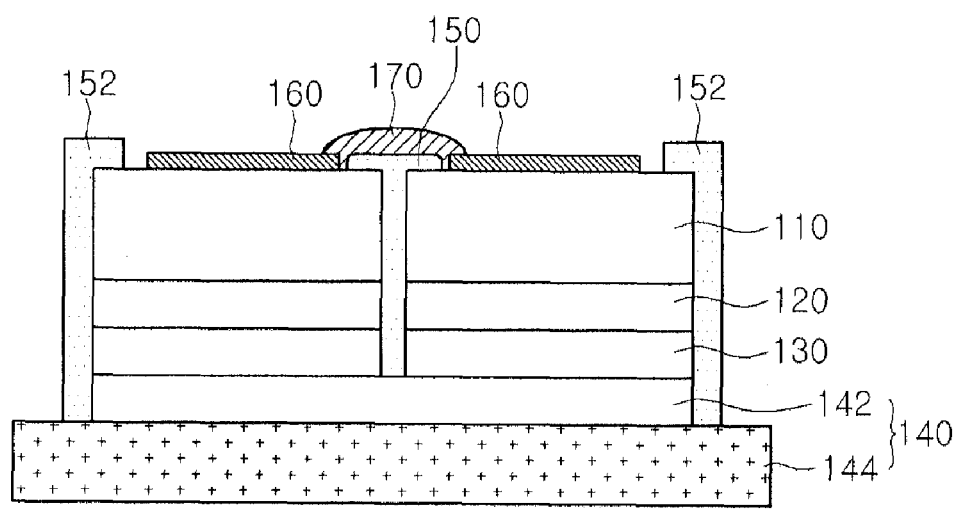
Figure 16:
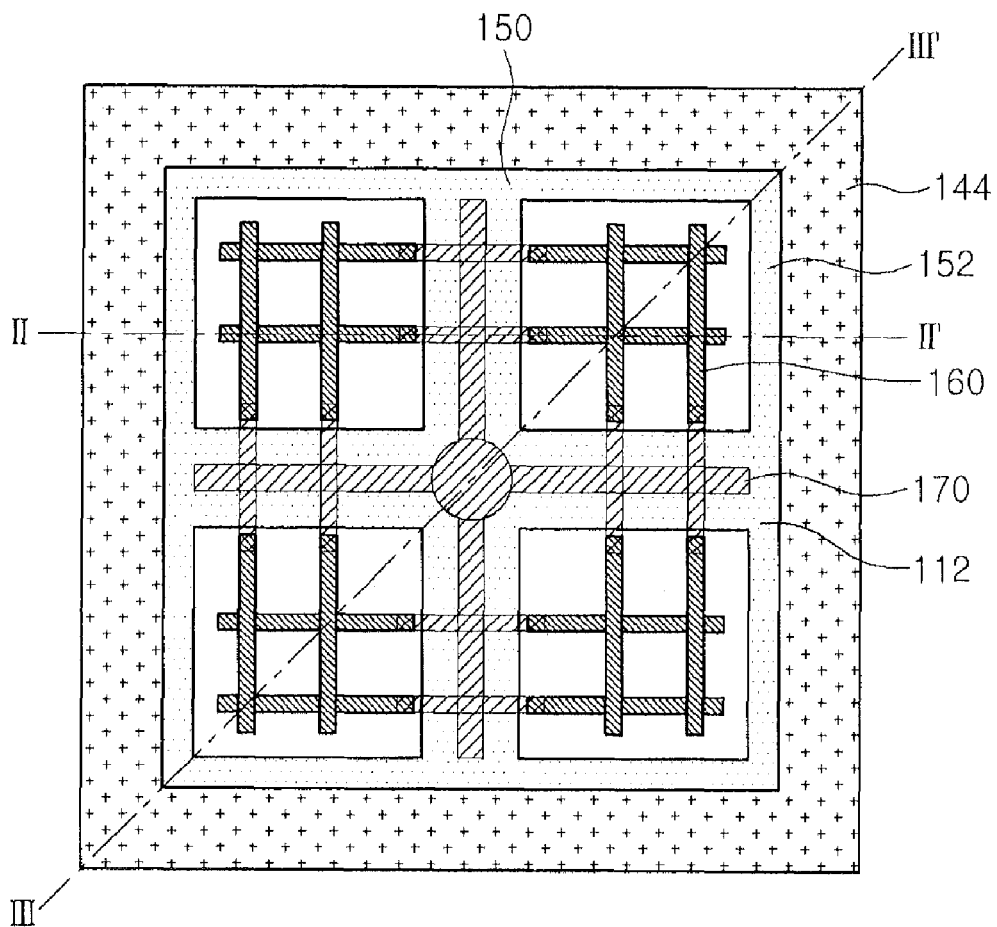
Figure 17:
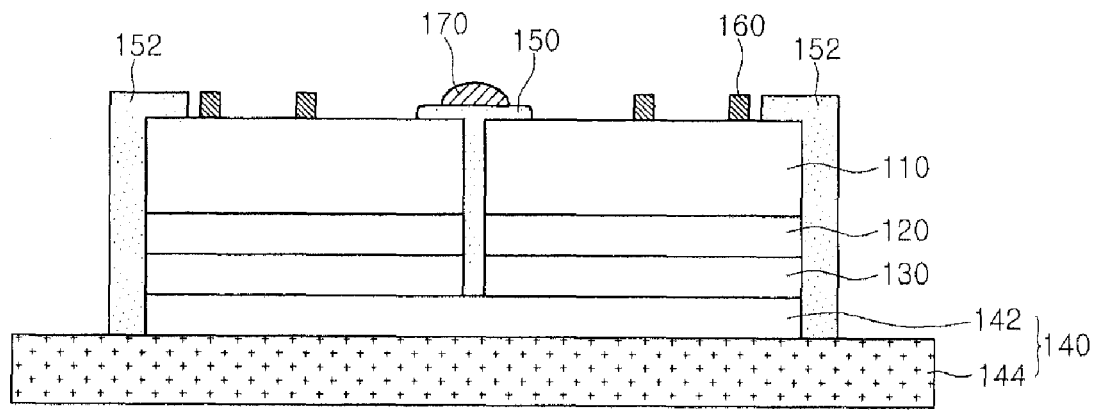

Subsequently, as shown in FIGS. 15, 16, and 17, the pad electrode 170 by which the first electrodes 160 are connected to each other may be formed over the first insulating layer 150. FIG. 15 is a cross-sectional view taken along line II-II' of FIG. 16 and FIG. 17 is a cross-sectional view taken along line of FIG. 16.

As shown in FIGS. 18 and 19, in the parallel type electrode as embodied and broadly described herein, which is a structure in which the pad electrode 170 is disposed over the first insulating layer 150 and the first electrodes 160 are disposed over the light emitting surface, current applied to the pad electrode 170 flows to the first electrodes 160 of the four divided light emitting surfaces formed over the first insulating layers 150. The pad electrode 170 and the first electrodes 160 may contact each other in parallel. In this embodiment, the pad electrode 170 may be formed at the center of the upper surface of the light emitting structure, such that it may have substantially the same current density (C) at the separated light emitting surface.

Therefore, the pad electrode 170 and the first electrode 160, which contact each other in parallel, are distributed to have the same current density (C) at each of the four divided light emitting surfaces such that a light emitting surface having uniform emission strength may be achieved.

In a light emitting device as embodied and broadly described herein, the parallel type electrode structure may solve the current bottleneck phenomenon (crowd phenomenon) as well as provide smooth current spreading.

The parallel type electrode structure may also provide uniform current density over the light emitting area, and so the activation area may generate uniform emission strength over the entire area by the n-i-p junction, making it possible to obtain improved effect of light amount.

Further, a light emitting device as embodied and broadly described herein forms an isolation having a wide specific surface area, thereby achieving excellent heat dissipation. In addition, the isolation having the relatively wider specific surface area may provide improved heat dissipation, thus improving high temperature reliability during extended operation time and improving characteristics in applications such as BLU, etc.

A light emitting device is provided that is capable of solving a current bottleneck phenomenon, or crowd phenomenon, while smoothly spreading current.

A light emitting device is provided that has excellent heat dissipating characteristics by forming isolation having a wide specific surface area.

As described above, a light emitting device may comprise a light emitting structure having a second conductive semiconductor layer, an active layer and a first conductive semiconductor layer; and a parallel type electrode structure formed over the light emitting structure. The parallel type electrode structure may be provided over the first conductive semiconductor layer. A second insulating layer may surround the outer portions of the first conductive semiconductor layer, the active layer, and the second conductive semiconductor layer.

A first insulating layer may separate the first conductive semiconductor layer, the active layer, the second conductive semiconductor layer into a plurality of areas. A first electrodes may be provided over the separated first conductive semiconductor layers. Each first electrode may be separately provided over the separated first conductive semiconductor layer. The first electrode may be provided over the separated first conductive semiconductor layer in a wing type or a grid type.

A pad may be provided over the first insulating layer. The pad may be provided at the center of the light emitting structure to connect the first electrodes. The pad may be provided over the first insulating layer and the first electrode is over the light emitting surface. The current applied to the pad may flow into the first electrodes of the light emitting surfaces divided in four through the pad electrode over the first insulating layer, the pad and the first electrode contacting each other in parallel. The pad and the first electrode, which contact each other in parallel, may have the same current density at the light emitting surfaces divided in four.

Further, a light emitting device may comprise a light emitting structure that includes a second conductive semiconductor layer, an active layer, and a first conductive semiconductor layer; a first insulating layer that separates the first conductive semiconductor layer, the active layer, the second conductive semiconductor layer into a plurality of areas; a first electrodes over the separated first conductive semiconductor layers; and a pad that is over the first insulating layer to connect the first electrodes.

The first electrode may be provided over the separated first conductive semiconductor layer in a wing type or a grid type. Each first electrode may be separately provided over the separated first conductive semiconductor layer.

A portion of the outer portions of a the first conductive semiconductor layer, the active layer, and the second conductive semiconductor layer may be removed. A second insulating layer may surround the outer portions of the first conductive semiconductor layer, the active layer, and the second conductive semiconductor layer.

The pad may be provided at the center of the light emitting structure to connect the first electrodes. The current applied to the pad may flow into the first electrodes of the light emitting surfaces divided in four through the pad electrode over the first insulating layer, the pad and the first electrode contacting each other in parallel. The pad and the first electrode, which contact each other in parallel, may have the same current density at the light emitting surfaces divided in four.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a plurality of light emitting elements formed on a first common electrode, each light emitting element having a first conductive layer formed over the first common electrode, an active layer formed over the first conductive layer and a second conductive layer formed over the active layer;
   at least one insulator formed between adjacent light emitting elements;
   a corresponding plurality of electrodes respectively formed on the plurality of light emitting elements, wherein the electrodes of adjacent light emitting elements are formed to be complementary in shape; and
   a second common electrode that couples the plurality electrodes.

2. The light emitting device of claim 1, wherein the second common electrode is formed over the at least one insulator.

3. The light emitting device of claim 1, wherein each electrode of the plurality of electrodes is formed on a corresponding portion of the second conductive layer of its respective light emitting element.

4. The light emitting device of claim 1, wherein the plurality of light emitting elements are substantially co-planar on the first common electrode.

5. The light emitting device of claim 1, wherein adjacent light emitting elements of the plurality of light emitting elements are separated by a trench, and the at least one insulator is formed in the trench.

6. The light emitting device of claim 5, wherein the trench separates active layers of adjacent light emitting elements.

7. The light emitting device of claim 1, wherein the active layer is made from a III-V group material.

8. The light emitting device of claim 7, wherein the III-V group material is GaN.

9. The light emitting device according to claim 1, wherein the second common electrode is located substantially at a center of the plurality of light emitting elements.

10. The light emitting device of claim 1, wherein current flows from the second common electrode to each of the plurality of electrodes using a separate current path.

11. The light emitting device of claim 1, wherein the first common electrode includes a reflective layer.

12. The light emitting device of claim 11, wherein the first common electrode further comprises at least one of an ohmic layer, a coupling layer, or a substrate.

13. The light emitting device of claim 12, wherein the ohmic layer comprises at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, or Ni/IrOx/Au/ITO.

14. The light emitting device of claim 1, wherein the at least one insulator comprises:
   a first insulator positioned between adjacent light emitting elements; and
   a second insulator that surrounds outer peripheral portions of the first conductive layer, the active layer, and the second conductive layer.

15. A method of making a light emitting element, the method comprising:
   forming a first conductive layer;
   forming an active layer;
   forming a second conductive layer;
   providing a first common electrode on the second conductive layer;
   forming at least one trench through the first conductive layer and the active layer to form a plurality of light emitting elements;
   respectively forming a plurality of electrodes on the plurality of light emitting elements, comprising forming an electrode on each of the plurality of electrodes defined by the at least one trench in a grid type arrangement; and
   forming a second common electrode to couple the plurality of electrodes.

16. The method of claim 15, further comprising:
   providing a first insulator in the at least one trench so as to isolate the plurality of light emitting elements; and
   providing a second insulator surrounding an outer peripheral portion of the first conductive layer, the active layer and the second conductive layer.

17. The method of claim 15, wherein providing a first common electrode on the second conductive layer comprises:
   providing an ohmic layer on the second conductive layer; and
   providing a substrate on a side of the ohmic layer opposite the second conductive layer, wherein forming at least one trench through the first conductive layer and the active layer further comprises extending the at least one trench through the second conductive layer and into the ohmic layer.

18. The method of claim 15, wherein forming at least one trench through the first conductive layer and the active layer further comprises extending the at least one trench into the second conductive layer.

19. A light emitting device, comprising:
a plurality of light emitting elements formed on a first common electrode, each light emitting element having a first conductive layer formed over the first common electrode, an active layer formed over the first conductive layer, and a second conductive layer formed over the active layer;
at least one insulator formed between adjacent light emitting elements;
a corresponding plurality of electrodes respectively faulted on the plurality of light emitting elements; and
a second common electrode that couples the plurality of electrodes, wherein the plurality of light emitting elements have parallel connection between the first common electrode and the second common electrode.

20. The light emitting device of claim 19, wherein the corresponding plurality of electrodes respectively formed on the plurality of light emitting elements are defined by at least one trench through the first conductive layer and the active layer in a grid type arrangement.

21. The light emitting device of claim 19, wherein the corresponding plurality of electrodes of adjacent light emitting elements are formed to be complementary in shape.

* * * * *